(12) United States Patent
Wang

(10) Patent No.: US 8,284,555 B2
(45) Date of Patent: Oct. 9, 2012

(54) HEAT-DISSIPATED FASTENER AND ELASTIC FRAME THEREOF

(75) Inventor: Cheng-Yu Wang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 250 days.

(21) Appl. No.: 12/615,934

(22) Filed: Nov. 10, 2009

(65) Prior Publication Data

US 2010/0128444 A1    May 27, 2010

(30) Foreign Application Priority Data

Nov. 27, 2008    (TW) ............................... 97145949 A

(51) Int. Cl.
*H05K 7/20* (2006.01)
(52) U.S. Cl. ......................................................... 361/711
(58) Field of Classification Search .................. 361/704, 361/711, 687, 700, 710, 709, 717–719, 722, 361/801
See application file for complete search history.

(56) References Cited

U.S. PATENT DOCUMENTS

| | | |
|---|---|---|
| 6,611,999 B1 | 9/2003 | Hsu |
| 2005/0180114 A1* | 8/2005 | Zhou et al. .................... 361/704 |

FOREIGN PATENT DOCUMENTS

| | | |
|---|---|---|
| CN | 2346005 | 10/1999 |
| CN | 1869873 | 11/2006 |
| TW | M276267 | 9/2005 |

* cited by examiner

*Primary Examiner* — Jeremy Norris
*Assistant Examiner* — Tremesha S Willis
(74) *Attorney, Agent, or Firm* — Muncy, Geissler, Olds & Lowe, PLLC

(57) ABSTRACT

A heat-dissipated fastener including a heat-dissipated plate, an elastic frame and a heat sink module is provided. The elastic frame includes a sheet element, multiple connecting ribs and multiple attaching portions. Two elastic arms extend from two corresponding sides of the sheet element, respectively. The attaching portions are located below the sheet element and attached to the heat-dissipated plate. The connecting ribs are connected to the attaching portion and the sheet element, and an accommodating space is formed by the connecting ribs, the sheet element and the heat-dissipated plate to accommodate the heat sink module. When the heat-dissipated plate is attached to the heat source and the elastic arms are bent and fixed to the circuit board of the heat source, the connecting ribs exert force on the heat-dissipated plate vertically, respectively.

14 Claims, 8 Drawing Sheets

HEAT-DISSIPATED FASTENER AND ELASTIC FRAME THEREOF

RELATED APPLICATIONS

This application claims priority to Taiwan Application Serial Number 97145949, filed Nov. 27, 2008, which is herein incorporated by reference.

BACKGROUND OF THE INVENTION

1. Field of the Invention

The invention relates to a heat-dissipated fastener and, more particularly, to a heat-dissipated fastener fixed to a heat source of a circuit board.

2. Description of the Related Art

A heat-dissipated fastener of a heat source (such as a central processing unit (CPU)) in a computer device is described as follows. A heat-dissipated plate is attached to the heat source to increase the contacting area and improve the heat sink efficiency. Four sheets are riveted at each of the four corners of the heat-dissipated plate in the radiating direction, respectively. The sheets are elastic, and they may be bent downward at the end and fixed at the circuit board where the heat source is disposed. Thus, the sheets make the heat-dissipated plate attached to the heat source effectively.

However, when the heat-dissipated plate is attached to the heat source, and the end of each sheet is fixed to the circuit board, force is exerted at the position where each sheet contacts the heat-dissipated plate. Thus, the heat-dissipated plate is irreparably deformed at the position where it contacts the sheets, and the heat-dissipated plate may be damaged.

BRIEF SUMMARY OF THE INVENTION

The invention provides a heat-dissipated fastener and an elastic frame thereof. In the invention, a heat-dissipated plate is attached to a heat source effectively, and the completeness of the heat-dissipated plate structure is kept.

The invention provides a heat-dissipated fastener adapted to be fixed at a heat source of a circuit board. The fastener includes a heat-dissipated plate, an elastic frame and a heat sink module. The elastic frame is composed of a sheet element, two elastic arms, multiple connecting ribs and multiple attaching portions. The sheet element is located at a first layer of the elastic frame, and the elastic arms extend from two sides of the sheet element. The attaching portions are located at the third layer of the elastic frame and attached to the heat-dissipated plate. In addition, the connecting ribs are located at the second layer of the elastic frame and connected to the attaching portions and the sheet element, respectively. An accommodating space is formed by the connecting ribs, the sheet element and the heat-dissipated plate. The heat sink module is located in the accommodating space and attached to the heat-dissipated plate.

When the heat-dissipated plate is attached to the heat source by the user and each elastic arm is bent towards the third layer, the connecting ribs exert force vertically to the heat-dissipated plate, respectively. When the end of each elastic arm is fixed to the circuit board, the force generated when the elastic arm is pressed downwardly makes the connecting ribs exert force vertically to the heat-dissipated plate to make the heat-dissipated plate attached to the heat source.

In a preferred embodiment of the invention, the connecting ribs may be vertically connected to the attaching portions and orthogonal to the heat-dissipated plate. Thus, since the connecting ribs are closer to the heat source than the elastic arms, when the elastic arms are fixed at the circuit board, the connecting ribs are forced to make the attaching portions press the heat-dissipated plate vertically to exert force intensively and averagely.

According to the description above, the elastic arms in the invention may have multiple embodiments. The elastic arms may be formed on an elastic frame and includes an arm body and at least fixing portion.

In a first embodiment, the arm body is T-shaped, and the fixing portion is located at the arm body at an end far away from the sheet element. Thus, a fastening bolt and the fixing portion work together to fix the end of the elastic arm on the circuit board.

In a second embodiment, the arm body is ⊣shaped, and it includes two parallel first extending bodies and a second extending body orthogonal to the first extending bodies. The fixing portions are located at two ends of the arm body which are far away from the sheet element, and the fastening bolts and the fixing portions work together to fix the end of the elastic arm to the circuit board.

In a third embodiment, the arm body is strip-shaped. The fixing portion is located at the arm body at an end far away from the sheet element, and the fastening bolt and the fixing portion work together to fix the end of the elastic arm at the circuit board.

In a fourth embodiment, the arm body is V-shaped, and an intersecting portion of the arm body is at the end of the elastic arms. The fixing portion is located at the intersecting portion of the arm body, and the fastening bolt and the fixing portion work together to fix the end of the elastic arm to the circuit board.

The heat sink module may have multiple heat pipes, fins or a heat-dissipated block.

DETAILED DESCRIPTION OF THE EMBODIMENTS

Figure 1:
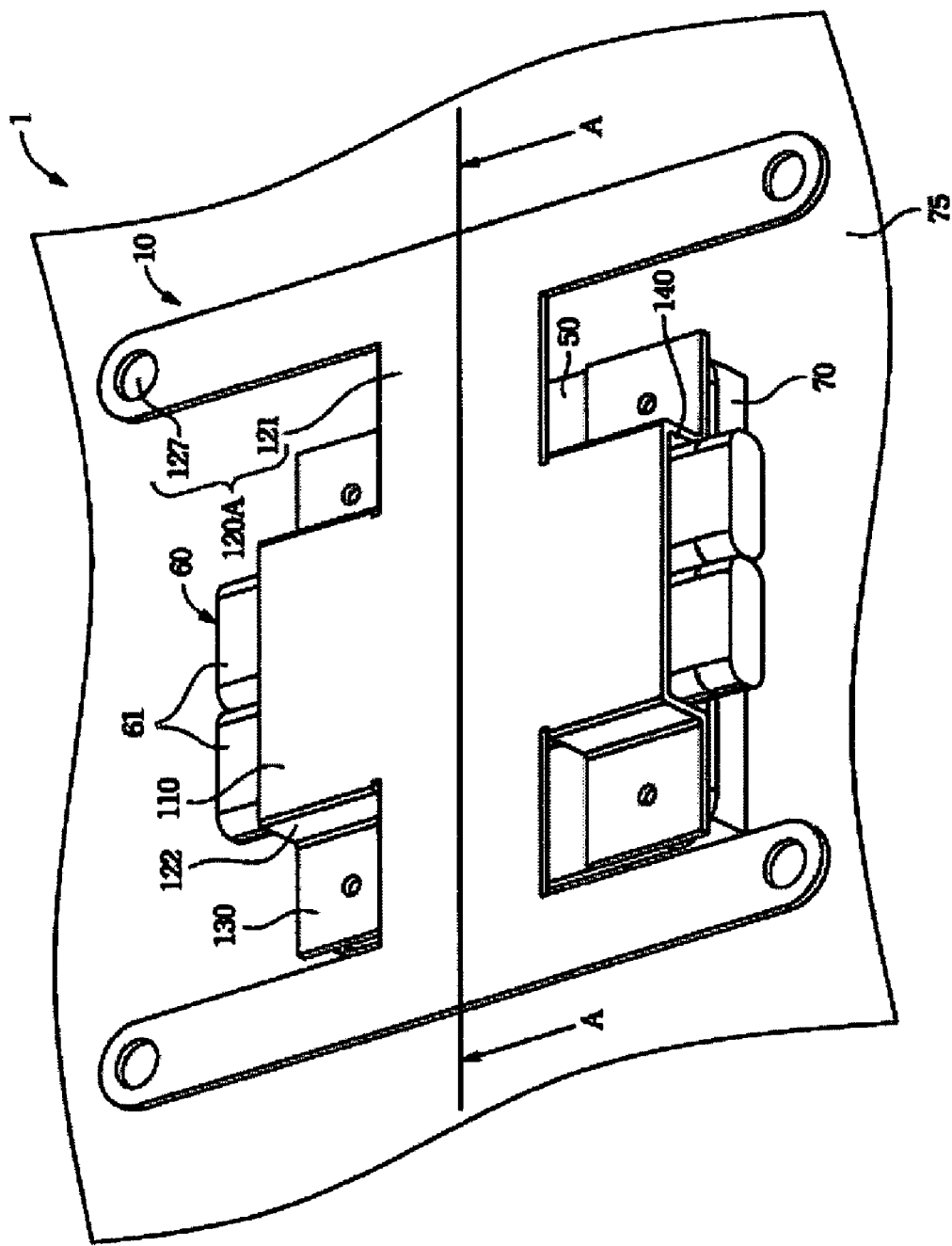
FIG. 1 is a three-dimensional schematic diagram showing the heat-dissipated fastener according to an embodiment of the invention.
Figure 2:
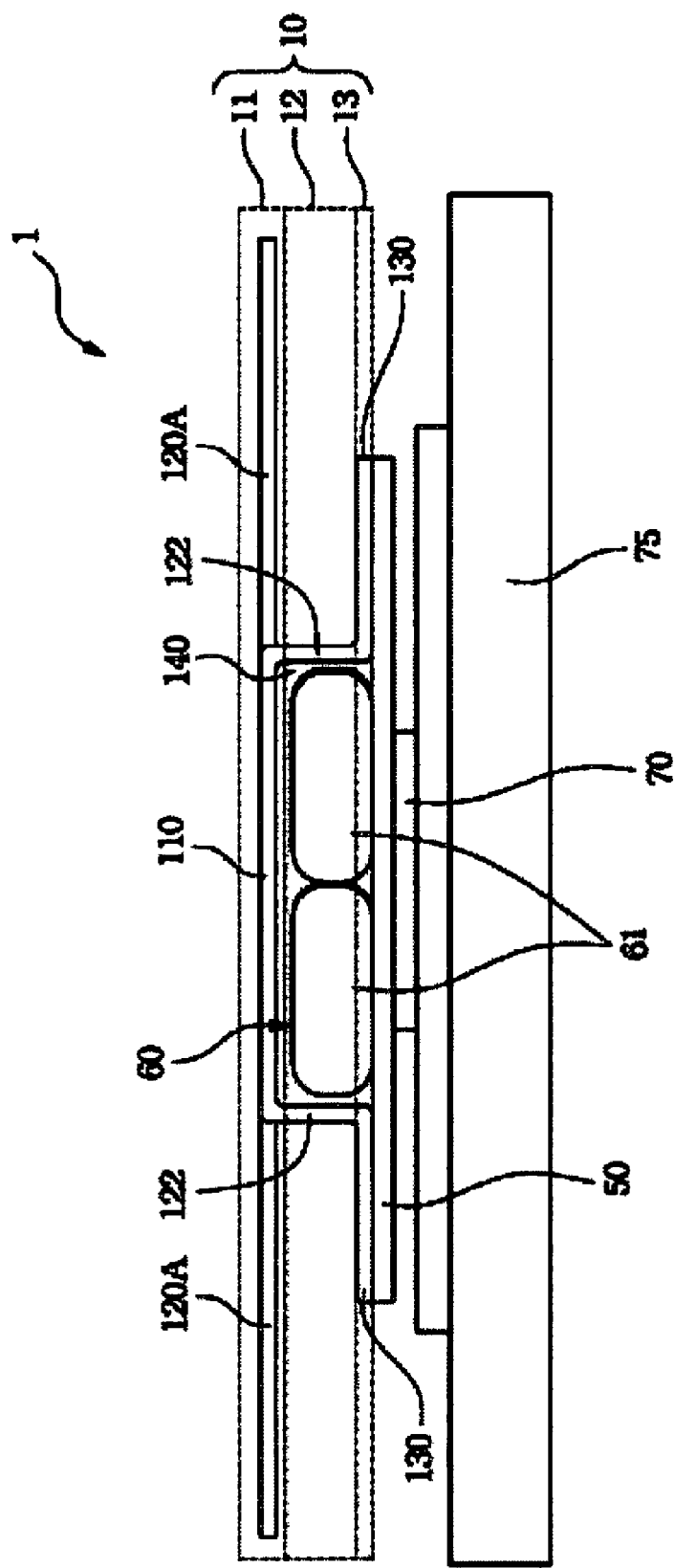
FIG. 2 is a sectional diagram showing the fastener in the embodiment in FIG. 1 taken along line A-A.

The invention provides a heat-dissipated fastener and an elastic frame thereof. As shown in FIG. 1 and FIG. 2, FIG. 1 is a three-dimensional schematic diagram showing the heat-dissipated fastener 1 according to an embodiment of the invention, and FIG. 2 is a sectional diagram showing the fastener in FIG. 1 taken along line A-A. The heat-dissipated fastener 1 is adapted to be fixed to a heat source 70 (such as a central processing unit (CPU) chip, a video graphics array (VGA) chip, a south/north bridge chip or other heat source) of a circuit board, and it includes a heat-dissipated plate 50, an elastic frame 10 and a heat sink module 60. The heat-dissipated plate 50 has high heat-conducting ability, and it is made of metal, ceramics material or other materials. The heat-dissipated plate 50 may flatly lean against to the surface of the heat source 70 to conduct heat generated by the heat source 70.

The section of the elastic frame 10 is, for example, Π shaped. The shape of the elastic frame 10 is shown in the drawing. The elastic frame 10 includes a first layer 11, a second layer 12 and a third layer 13. The first layer 11 of the elastic frame 10 is mainly a sheet element 110, and two elastic arms 120A extend from two corresponding sides towards the opposite directions, respectively. The third layer 13 of the elastic frame 10 has multiple attaching portions 130, and the attaching portions 130 are attached to the heat-dissipated plate 50 at the surface far away from the heat source 70. The second layer 12 of the elastic frame 10 is located between the first layer 11 and the third layer 13. A connecting rib 122 is disposed between the attaching portion 130 and the sheet element 110 at the side with the elastic frame 120A. An accommodating space 140 is formed by the sheet element 110 of the elastic frame 10, the connecting rib 122 and the heat-dissipated plate 50.

The shape Π of the elastic frame 10 is only taken as an example, and the invention is not limited thereto. In other embodiments, the shape, the bending angle and the size proportion of the elastic frame 10 may be adjusted according to requirements.

Figure 3:
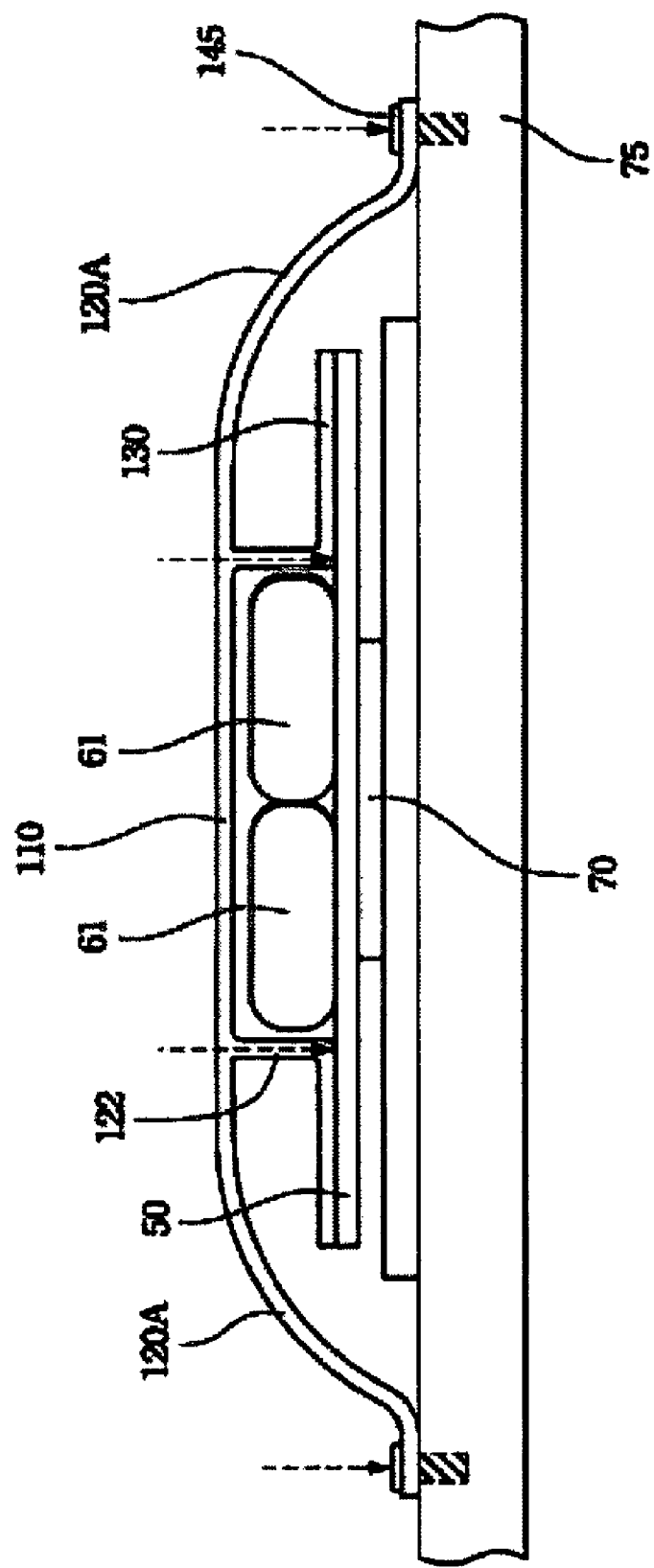
FIG. 3 is a schematic diagram showing the operation and force distribution in the embodiment in FIG. 1.

As shown in FIG. 2 and FIG. 3, FIG. 3 is a schematic diagram showing the operation and force distribution of the fastener in FIG. 1. When a user attaches the heat-dissipated plate 50 to the heat source 70, bends the elastic arms 120A of the sheet element 110 and fixes the end of the elastic arms 120A to the circuit board 75 (such as a motherboard) below the heat source 70, a force is generated when the elastic arms 120A is pressed. Then, the connecting rib 122 closer to the heat source 70 is forced to exert force to the heat-dissipated plate 50 vertically. Thus, the heat-dissipated plate 50 presses the heat source 70 intensively and averagely, and the probability of deformation of the heat-dissipated plate 50 is reduced. Therefore, in the invention, a simple structure may be used to make the heat-dissipated plate 50 attached to the heat source 70 effectively. Since the elastic frame 10 is easy to be manufactured, the heat-dissipated fastener 1 in the embodiment may have a lower cost.

As shown in FIG. 2, the elastic frame 10 is, for example, integrally formed, and components on it are manufactured by a metal plate in a stamping process. Each connecting rib 122 may be vertically disposed between the attaching portions 130 and the heat-dissipated plate 50. When the attaching portions 130 are fixed on the heat-dissipated plate 50, the connecting ribs 122 may exert force on the heat-dissipated plate 50 vertically.

In addition, via the above stamping process, as long as the force pressing the heat source 70 is exerted on the heat-dissipated plate 50 intensively and averagely, the shape of the elastic arms 120A of the elastic frame 10 also may be designed according to different positions of the heat source 70 on the circuit board 75. Thus, the design of the heat-dissipated fastener 1 is flexible.

Figure 4:
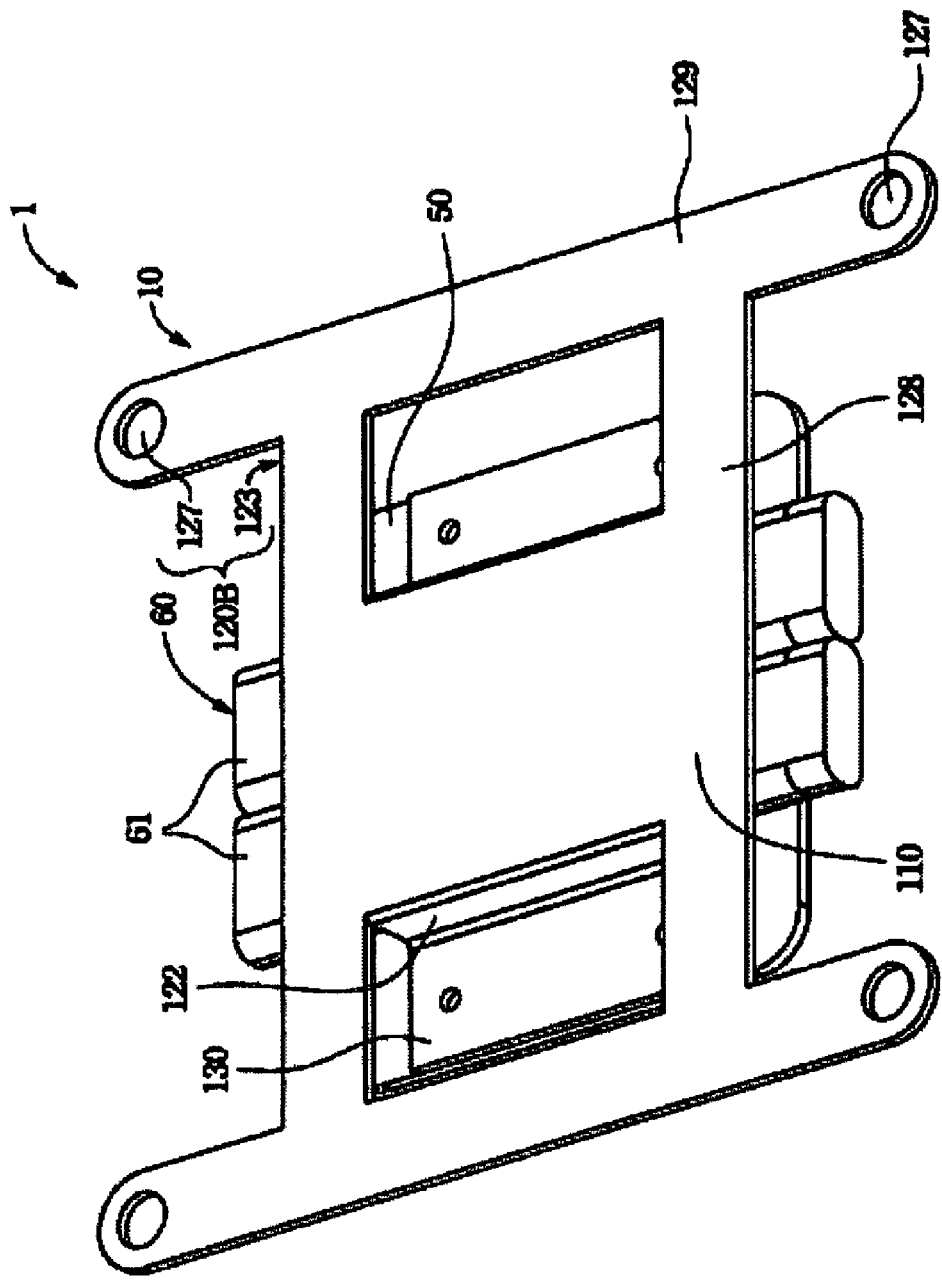
FIG. 4 is a three-dimensional diagram showing the heat-dissipated fastener in the second embodiment of the invention.
Figure 5:
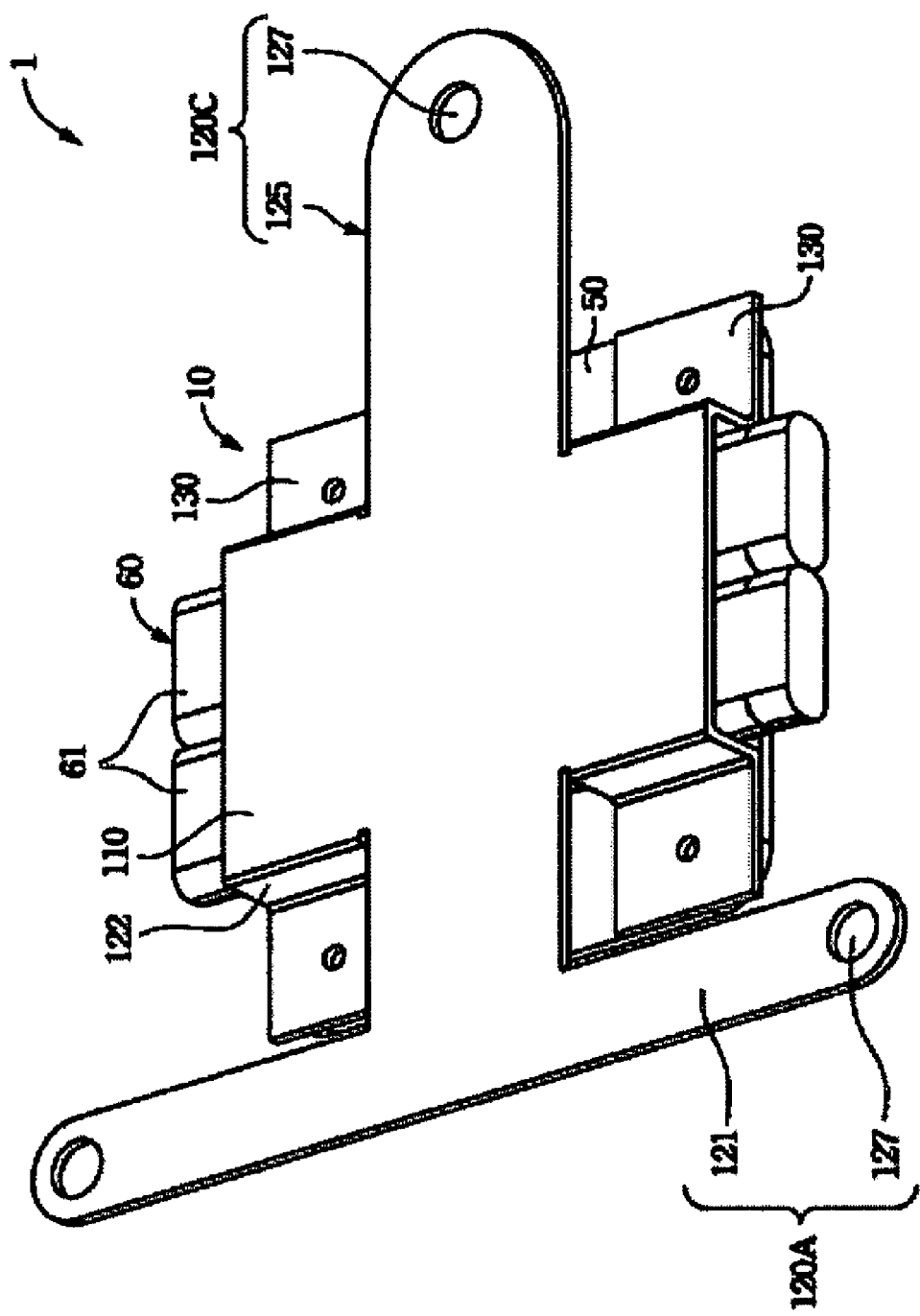
FIG. 5 is a three-dimensional schematic diagram showing the third embodiment in the invention.

According to the above description of the invention, multiple kinds of elastic arms 120A (as shown in FIG. 1), 120B (as shown in FIG. 4) or 120C (as shown in FIG. 5) are described. Two elastic arms 120A at the two ends of the elastic frame 10 are not limited to be symmetrical to each other, and the elastic frame 10 also may have characteristics of all the elastic arms 120A, 120B and 120C.

In a first embodiment of the invention, as shown in FIG. 1, the elastic arm 120A includes an arm body 121 and at least a fixing portion 127. The arm body 121 is T-shaped, and the bottom part of the T-shaped arm body 121 is connected to the long side of the sheet element 110. The top part of the T-shaped arm body 121, namely the portion far away from the sheet element 110, has two fixing portions 127 at the two corresponding ends, respectively. The two fixing portions 127 are located at the ends of the elastic arms 120A, and two fastening bolts 145 (as shown in FIG. 3) are used to fix the elastic arms 120A on the circuit board 75. In the first embodiment, there are two attaching portions 130 and two connecting ribs 122, and they are located at two sides of the arm body 121.

In a second embodiment of the invention, as shown in FIG. 4, it is a three-dimensional diagram showing the heat-dissipated fastener 1 in the second embodiment of the invention. The elastic arm 120B includes an arm body 123 and at least a fixing portion 127. The arm body 123 is ⊣shaped, and it may be considered as two parallel first extending bodies 128 connected to an orthogonal second extending body 129. The ends of the two first extending bodies 128 far away from the second extending body 129 are connected to the sheet element 110, and each of two corresponding ends of the second extending body 129 have a fixing portion 127. The fixing portions 127 may be fixed on the circuit board 75 by two fastening bolts, respectively.

In a third embodiment of the invention, as show in FIG. 5, it is a three-dimensional schematic diagram showing the third embodiment in the invention. The elastic arm 120C includes an arm body 125 and a fixing portion 127. The arm body 125 is strip-shaped, and the fixing portion 127 is located at the arm body at the end far away from the sheet element 110. The fixing portion 127 may be fixed on the circuit board by the fastening bolt.

Figure 6:
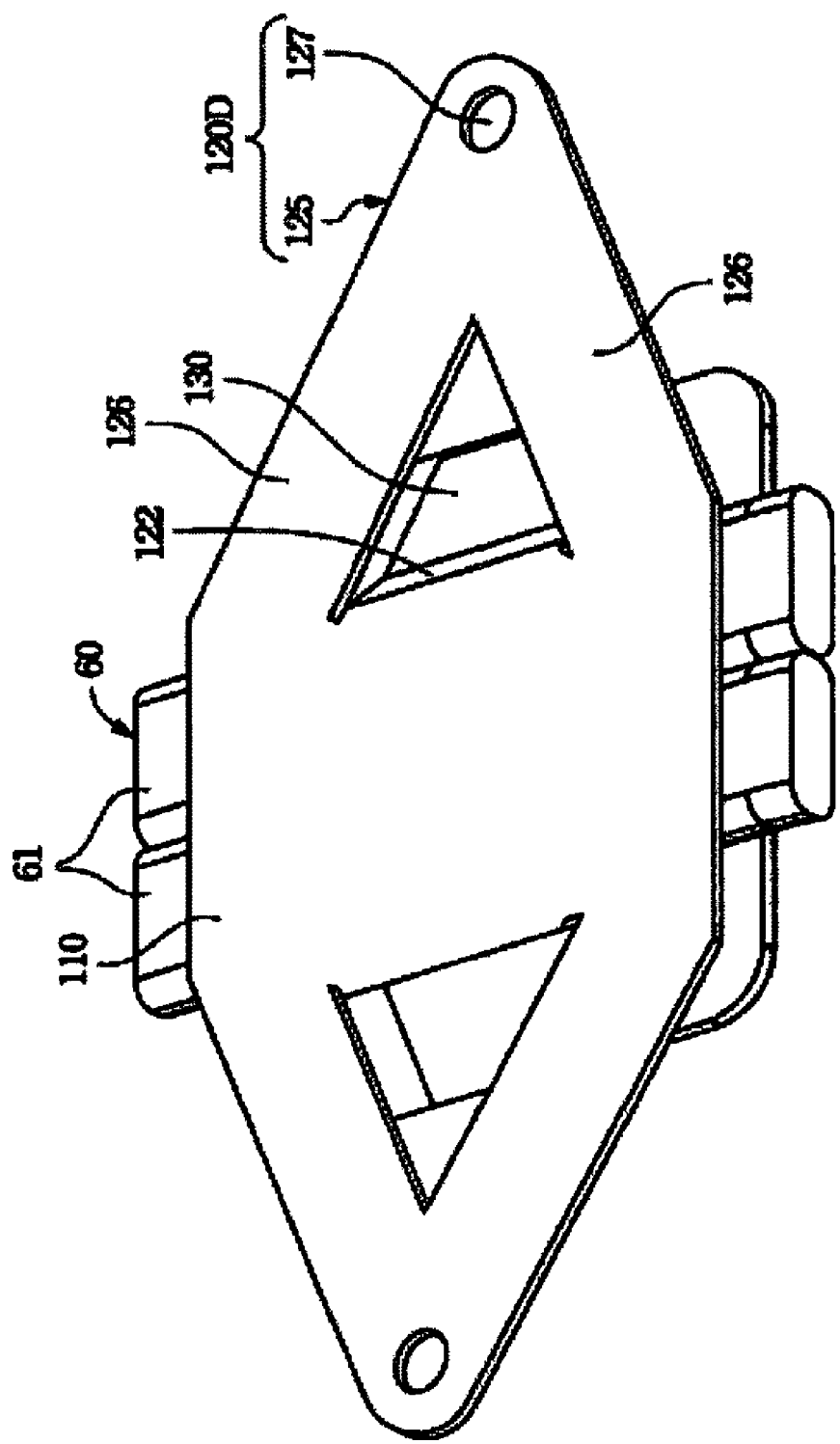
FIG. 6 is a three-dimensional schematic diagram showing the fourth embodiment of the invention.

In a fourth embodiment, as shown in FIG. 6, it is a three-dimensional schematic diagram showing the fourth embodiment of the invention. The elastic arm 120D includes an arm body 125 and a fixing portion 127. The arm body 125 is V-shaped, and it includes two intersecting third extending bodies 126, and the fixing portion 127 is located at the arm body 125 at the end far away from the sheet element 110, namely the intersecting position of the two third extending bodies 126. The fastening bolt may be used to fasten the end of the elastic arm 120D on the circuit board. In the fourth embodiment, the shape of the attaching portion 130 and the connecting rib 122 is triangle, and it is manufactured on the arm body 125 in a stamping process.

The embodiments above are just examples, and any one skilled in the art may design a Y-shaped or L-shaped arm body or an arm body with other shapes according to above characteristics. The number and size of the fixing portions 127 may be designed according to the force that is needed to fix the ends of the elastic arms 120A, 120B, 120C and 120D on the circuit board 75. If only the force may be exerted on the heat-dissipated plate 50 intensively and averagely when the two elastic arms 120A, 120B, 120C and 120D are bent toward the third layer 13 of the elastic frame 10, the number may be one.

Figure 7:
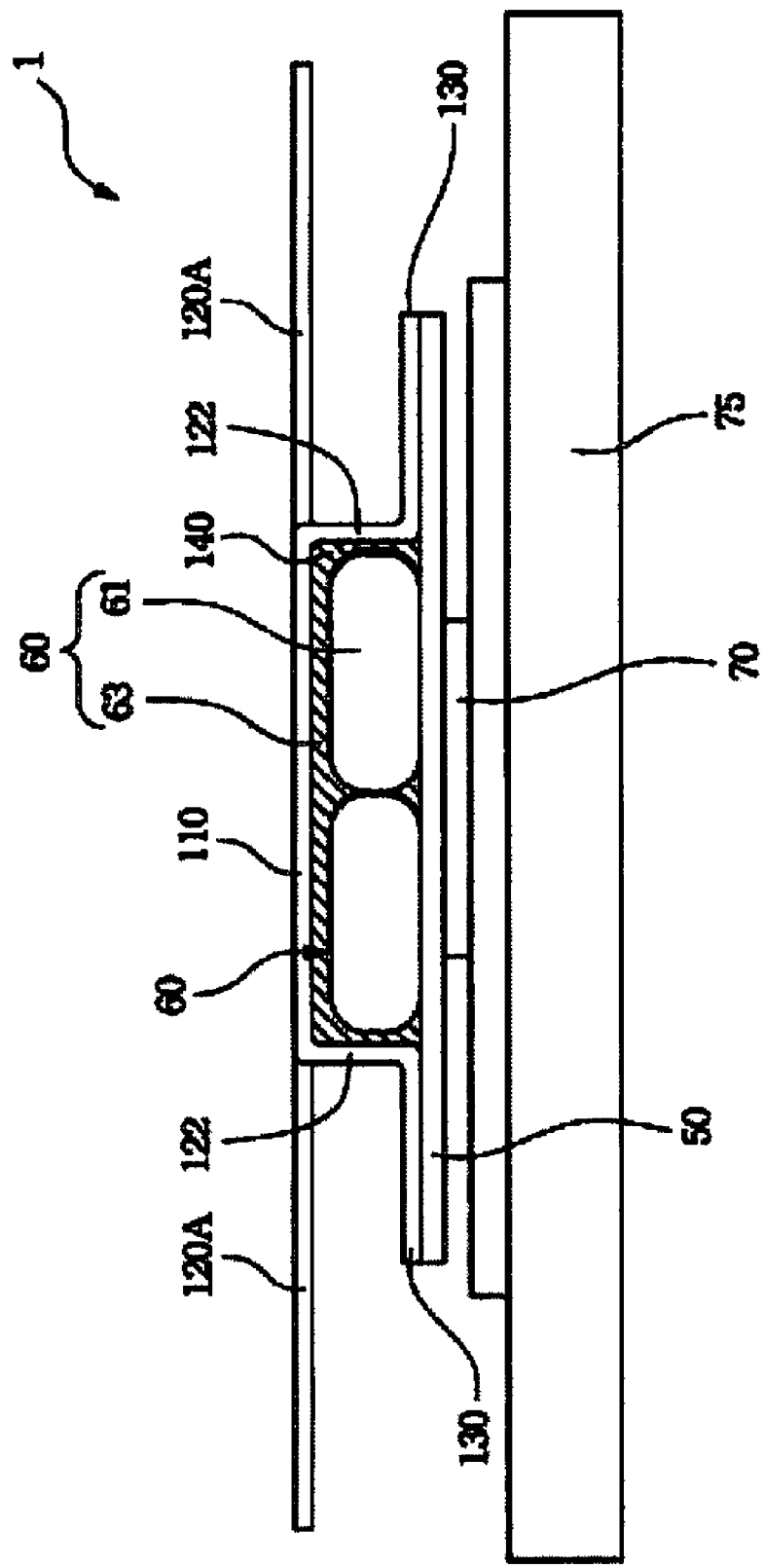
FIG. 7 is a sectional diagram showing the heat-dissipated fastener having a heat-dissipated block in an embodiment of the invention.
Figure 8:
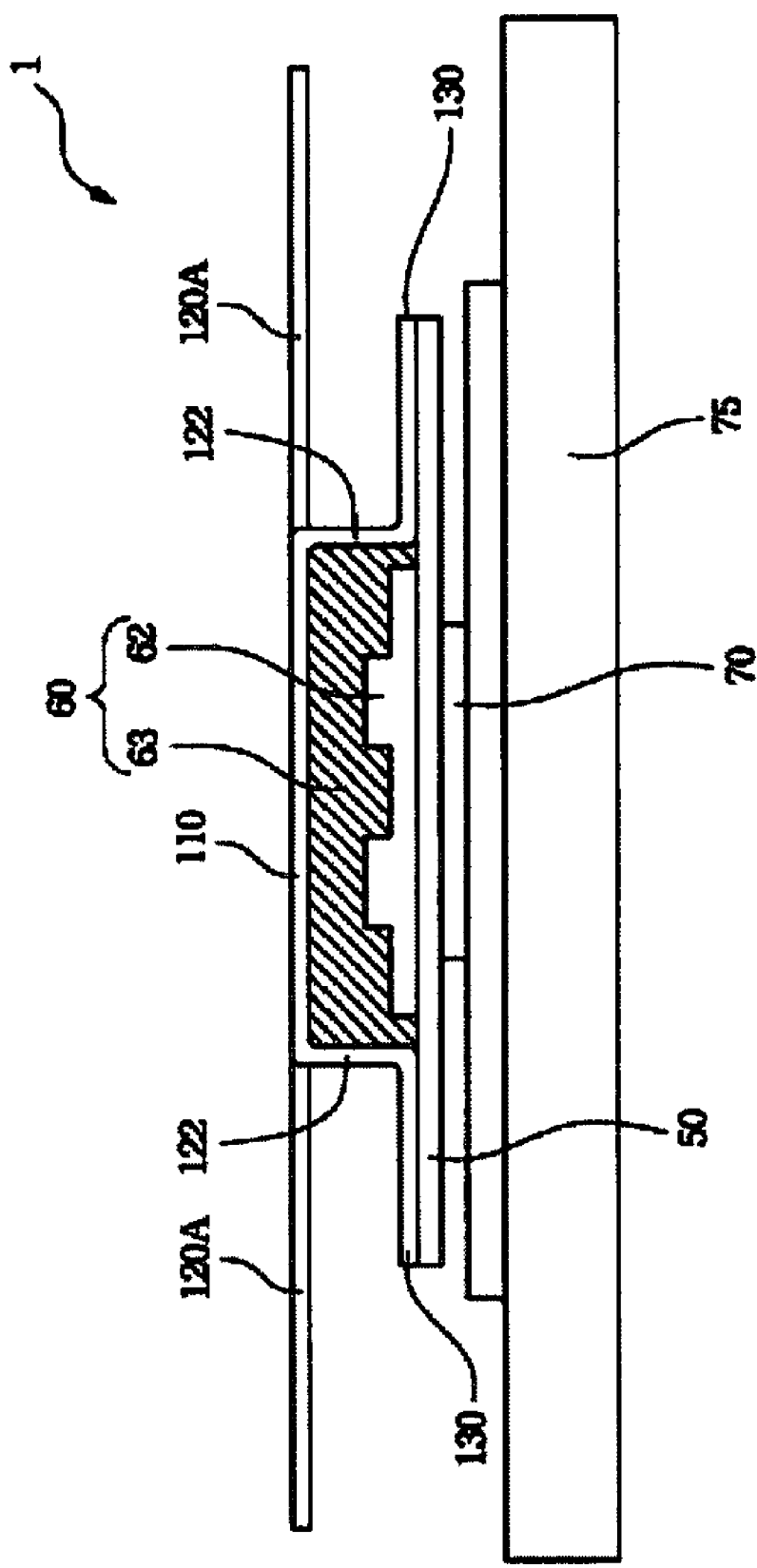
FIG. 8 is a sectional diagram showing the heat-dissipated fastener having another kind of heat-dissipated block in an embodiment of the invention.

In addition, as shown in FIG. 1 to FIG. 4, a heat sink module 60 may be accommodated in the accommodating space 140. Part of the heat sink module 60 is attached to the heat-dissipated plate 60 at the surface far away from the heat source 70 in the accommodating space 140. The other part passes the accommodating space 140, and it may be connected to another heat sink module 60 (not shown) to dissipate heat generate by the heat source. As shown in FIG. 7 and FIG. 8, FIG. 7 is a sectional diagram showing the heat-dissipated fastener 1 having a heat-dissipated block 63, and FIG. 8 is a sectional diagram showing the heat-dissipated fastener 1 having another kind of heat-dissipated block 63. The heat sink module 60 may be only multiple heat pipes 61 or fins 62, or it may be the composition of heat pipes 61, fins 62 and the heat-dissipated block 63. The heat-dissipated block 63 may fill the accommodating space 140, and it may allow the heat pipes 61 or the fins 62 to lengthwise pass through.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat-dissipated fastener adapted to be fixed on a heat source of a circuit board, comprising:
    a heat-dissipated plate;
    an elastic frame, including:
        a sheet element having at least two elastic arms;
        multiple attaching portions attached to the heat-dissipated plate; and
        multiple connecting ribs connected to the attaching portions and the sheet element, wherein an accommodating space is formed by the connecting ribs, the sheet element and the heat-dissipated plate; and
    a heat sink module located in the accommodating space and attached to the heat-dissipated plate,
    wherein when the heat-dissipated plate is attached to the heat source and the elastic arms are fixed to the circuit board, the connecting ribs exert force on the heat-dissipated plate.

2. The heat-dissipated fastener according to claim 1, wherein the connecting ribs are connected to the attaching portions and the sheet element with the elastic arms vertically.

3. The heat-dissipated fastener according to claim 1, wherein every elastic arm comprises an arm body and at least a fixing portion.

4. The heat-dissipated fastener according to claim 3, wherein the arm body is T-shaped, and the fixing portion is located at the arm body at the end far away from the sheet element.

5. The heat-dissipated fastener according to claim 3, wherein the arm body is ⊣-shaped and comprises two parallel first extending bodies and a second extending body orthogonal to the first extending bodies, and the fixing portions are located at two ends of the second extending body.

6. The heat-dissipated fastener according to claim 3, wherein the arm body is V-shaped and comprises two intersecting third extending bodies, and the fixing portion is located at the intersecting portion of the third extending bodies.

7. The heat-dissipated fastener according to claim 3, wherein the arm body is strip-shaped, and the fixing portion is located at the arm body at the end far away from the sheet element.

8. The heat-dissipated fastener according to claim 1, wherein the heat sink module has multiple heat pipes.

9. The heat-dissipated fastener according to claim 1, wherein the heat sink module further comprises a heat-dissipated block, and heat pipes pass through the heat-dissipated block.

10. An elastic frame adapted to locate a heat-dissipated plate to a heat source, comprising:
    a sheet element having two elastic arms;
    multiple attaching portions attached to the heat-dissipated plate; and
    multiple connecting ribs connected to the attaching portions and the sheet element;
    wherein when the attaching portions are attached to the heat-dissipated plate and each of the elastic arms is bent towards the heat-dissipated plate, the connecting ribs exert force on the heat-dissipated plate vertically, respectively.

11. The elastic frame according to claim 10, wherein the elastic arm comprises a T-shaped arm body, and a fixing portion is located at the arm body at the end far away from the sheet element.

12. The elastic frame according to claim 10, wherein the elastic arm comprises a ⊣-shaped arm body, and the arm body comprises two parallel first extending bodies and a second extending body orthogonal to the first extending bodies, and a fixing portion is located at each of the two corresponding ends of the second extending body.

13. The elastic frame according to claim 10, wherein the elastic arm comprises a strip-shaped arm body, and a fixing portion is located at the arm body at the end far away from the sheet element.

14. The elastic frame according to claim 10, wherein the elastic arm comprises a V-shaped arm body including two intersecting third extending bodies, and a fixing portion is located at the intersecting portion of the third extending bodies.

* * * * *